(12) United States Patent
Tanaka (10) Patent No.: US 9,611,136 B2
(45) Date of Patent: *Apr. 4, 2017

(54) MEMS HAVING A CUTOUT SECTION ON A CONCAVE PORTION BETWEEN A SUBSTRATE AND A STATIONARY MEMBER

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/169,368

(22) Filed: May 31, 2016

(65) Prior Publication Data

US 2016/0272483 A1   Sep. 22, 2016

Related U.S. Application Data (63) Continuation of application No. 14/687,057, filed on Apr. 15, 2015, now Pat. No. 9,376,313.

(30) Foreign Application Priority Data

Apr. 18, 2014   (JP) .................................. 2014-086583

(51) Int. Cl.
*G01L 9/00* (2006.01)
*H01L 21/00* (2006.01)
(Continued)

(52) U.S. Cl.
CPC .......... *B81B 3/0072* (2013.01); *B81B 3/0018* (2013.01); *B81B 7/007* (2013.01);
(Continued)

(58) Field of Classification Search
CPC . H01L 23/528; H01L 21/76205; H01L 24/02; B81B 7/007; B81C 1/00158; G01L 9/0042
See application file for complete search history.

(56) References Cited

U.S. PATENT DOCUMENTS

| 5,719,073 A | 2/1998 | Shaw et al. |
| 6,388,300 B1 | 5/2002 | Kano et al. |
| (Continued) | | |

FOREIGN PATENT DOCUMENTS

| JP | 2001-330623 A | 11/2001 |
| JP | 2002-303636 A | 10/2002 |
| (Continued) | | |

*Primary Examiner* — Alonzo Chambliss
(74) *Attorney, Agent, or Firm* — Harness, Dickey & Pierce, P.L.C.

(57) ABSTRACT

A functional element includes a substrate which is provided with a concave section; a stationary section connected to a wall section that defines the concave section of the substrate; an elastic section which extends from the stationary section and is capable of stretching and contracting in a first axis direction; a movable body connected to the elastic section; a movable electrode section which extends from the movable body. The concave section includes a cutout section which is provided on the wall section. The stationary section includes an overlap section which is spaced with the substrate, and overlaps the concave section when seen in a plan view. At least a portion of the overlap section overlaps the cutout section when seen in the plan view, and the elastic section extends from the overlap section.

11 Claims, 10 Drawing Sheets

(51) Int. Cl.
*H05K 7/02* (2006.01)
*G01P 15/08* (2006.01)
*B81B 3/00* (2006.01)
*H01L 23/00* (2006.01)
*B81C 1/00* (2006.01)
*H01L 23/528* (2006.01)
*H01L 21/762* (2006.01)
*B81B 7/00* (2006.01)
*G01C 19/5656* (2012.01)

(52) U.S. Cl.
CPC ...... *B81C 1/00158* (2013.01); *G01C 19/5656* (2013.01); *G01L 9/0042* (2013.01); *H01L 21/76205* (2013.01); *H01L 23/528* (2013.01); *H01L 24/02* (2013.01); *B81B 2201/0235* (2013.01); *B81B 2201/0242* (2013.01); *B81B 2203/0118* (2013.01); *B81B 2207/097* (2013.01); *B81C 2203/0109* (2013.01); *H01L 2224/0212* (2013.01); *H01L 2924/15* (2013.01); *H01L 2924/351* (2013.01)

(56) References Cited

U.S. PATENT DOCUMENTS

| | | |
|---|---|---|
| 6,494,096 B2 | 12/2002 | Sakai et al. |
| 6,841,840 B2 | 1/2005 | Sakai |
| 9,086,428 B2 | 7/2015 | Yoda et al. |
| 9,144,159 B2 | 9/2015 | Takagi |
| 9,165,874 B2 | 10/2015 | Furuhata |
| 9,376,313 B2 * | 6/2016 | Tanaka .................. B81B 3/0072 |
| 2004/0094814 A1 | 5/2004 | Yoshioka et al. |
| 2009/0007669 A1 | 1/2009 | Fukaura |
| 2009/0151429 A1 | 6/2009 | Jun et al. |
| 2013/0042685 A1 | 2/2013 | Yoda |
| 2013/0256814 A1 | 10/2013 | Tanaka |
| 2015/0001653 A1 | 1/2015 | Schelling et al. |
| 2015/0014799 A1 | 1/2015 | Tanaka |

FOREIGN PATENT DOCUMENTS

| | | |
|---|---|---|
| JP | 2002-365306 A | 12/2002 |
| JP | 2004-069562 A | 3/2004 |
| JP | 2008-281351 A | 11/2008 |
| JP | 2013-127436 A | 6/2013 |

* cited by examiner

MEMS HAVING A CUTOUT SECTION ON A CONCAVE PORTION BETWEEN A SUBSTRATE AND A STATIONARY MEMBER

CROSS-REFERENCE TO RELATED APPLICATIONS

This is a continuation application of U.S. application Ser. No. 14/687,057, filed on Apr. 15, 2015, which claims priority to Japanese Patent Application No. 2014-086583, filed on Apr. 18, 2014. Both applications are expressly incorporated by reference herein in their entireties.

BACKGROUND

1. Technical Field

The present invention relates to a functional element having a cutout section in a wall.

2. Related Art

Recently, there has been developed, a functional element (a physical quantity sensor) which detects a physical quantity such as an acceleration using, for example, a technique of a silicon micro electro mechanical systems (MEMS).

For example, JP-A-2001-330623 describes a physical quantity sensor which has a configuration in which two ends of a rectangular weight section are integrally coupled with an anchor section through a beam section so as to detect an acceleration and the like, based on a variation in capacitance between a movable electrode and a stationary electrode which are formed in both sides of the weight section.

In the physical quantity sensor described above, however, there may be a case where a material of the anchor (a stationary section) is different from that of a member (substrate) to which the anchor is fixed. For this reason, there may be a case where stress occurs in a bonding section of the stationary section which is bonded to the substrate, due to a difference between a linear expansion coefficient of the substrate and a linear expansion coefficient of the stationary section. When the beam section (an elastic section) is sensitive to a characteristic of the physical quantity sensor and is provided near to the bonding section, a magnitude of the stress generated on the bonding section changes according to an ambient temperature of the physical quantity sensor. Therefore, a temperature characteristic of the physical sensor is degraded.

SUMMARY

An advantage of some aspects of the invention is to provide a functional element which can have an excellent temperature characteristic. Further, another advantage of some aspects of the invention is to provide an electronic apparatus or a mobile entity which includes the functional element described above.

The invention can be realized in the following form or application examples.

Application Example 1

According to this application example, there is provided a functional element including: a substrate which is provided with a concave section; a stationary section connected to a wall section that defines the concave section of the substrate; an elastic section which extends from the stationary section and is capable of stretching and contracting in a first axis direction; a movable body connected to the elastic section; a movable electrode section which extends from the movable body; and a stationary electrode section which is connected to the substrate and extends in an extending direction of the movable electrode section. Herein the concave section includes a cutout section which is provided on the wall section, the stationary section includes an overlap section which is spaced with the substrate, and overlaps the concave section when seen in a plan view, at least a portion of the overlap section overlaps the cutout section when seen in the plan view, and the elastic section extends from the overlap section.

In the functional element, when seen in the plan view, a distance (the shortest length) from a boundary between the bonding section of the stationary section bonded to the substrate and the overlap section to a boundary between the overlap section and the elastic section can be made longer while the distance passes through the overlap section, compared with a case where the cutout section is not provided. Therefore, when a stress occurs on the bonding section of the stationary section which is bonded to the substrate due to a difference between a linear expansion coefficient of the substrate and a linear expansion coefficient of the stationary section, it is possible to decrease an influence that the stress may exert upon the elastic section. As a result, the functional element can have an excellent temperature characteristic.

Application Example 2

In the functional element according to the application example, it is preferable that the stationary section includes an extension section which extends from the overlap section in a second axis direction intersecting with the first axis direction when seen in the plan view.

In the functional element, when seen in the plan view, the stationary section can have a large area of the bonding section bonded to the substrate and also can be further stably fixed to the substrate, compared with a case where the extension section is not provided.

Application Example 3

In the functional element according to the application example, it is preferable that a width of the cutout section in the first axis direction is wider than a width of the portion of the overlap section overlapping the cutout section in the first axis direction when seen in the plan view.

In the functional element, when a stress occurs on the bonding section of the stationary section which is bonded to the substrate due to a difference between a linear expansion coefficient of the substrate and a linear expansion coefficient of the stationary section, it is possible to further decrease an influence that the stress may exert upon the elastic section.

Application Example 4

In the functional element according to the application example, it is preferable that a material of the substrate is glass, and a material of the stationary section is silicon.

In the functional element, the silicon substrate is subjected to the machining process so as to be able to form the movable body, and the silicon substrate for forming the movable body can be bonded to the substrate through an anodic bonding.

Application Example 5

In the functional element according to the application example, it is preferable that the concave section is continuous with the cutout section and includes a receiving section which receives the movable body. When seen in the plan view, the overlap section includes a first portion overlapping the cutout section and a second portion overlapping the receiving section. Further, it is preferable that when seen in the plan view, a width of the cutout section in the second axis direction which intersects the first axis direction is wider than a width of the second portion in the second axis direction.

In the functional element, when seen in a plan view, and when a stress occurs on the bonding section of the stationary section which is bonded to the substrate due to a difference between a linear expansion coefficient of the substrate and a linear expansion coefficient of the stationary section, it is possible to further decrease an influence that the stress may exert upon the elastic section.

Application Example 6

According to this application example, there is provided an electronic apparatus including any one of the functional elements described above.

The electronic apparatus includes any one of the functional elements described above so as to be capable of having an excellent temperature characteristic.

Application Example 7

According to this application example, there is provided a mobile entity including any one of the functional elements described above.

The mobile entity includes any one of the functional elements described above so as to be capable of having an excellent temperature characteristic.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the preferable embodiments of the invention will be described in detail with reference to the accompanied drawings. The embodiments to be described below do not limit contents of the invention described in claims improperly. Further, the essential configuration condition of the invention is not limited to all of the configurations to be described below.

1. Functional Element

Figure 1:
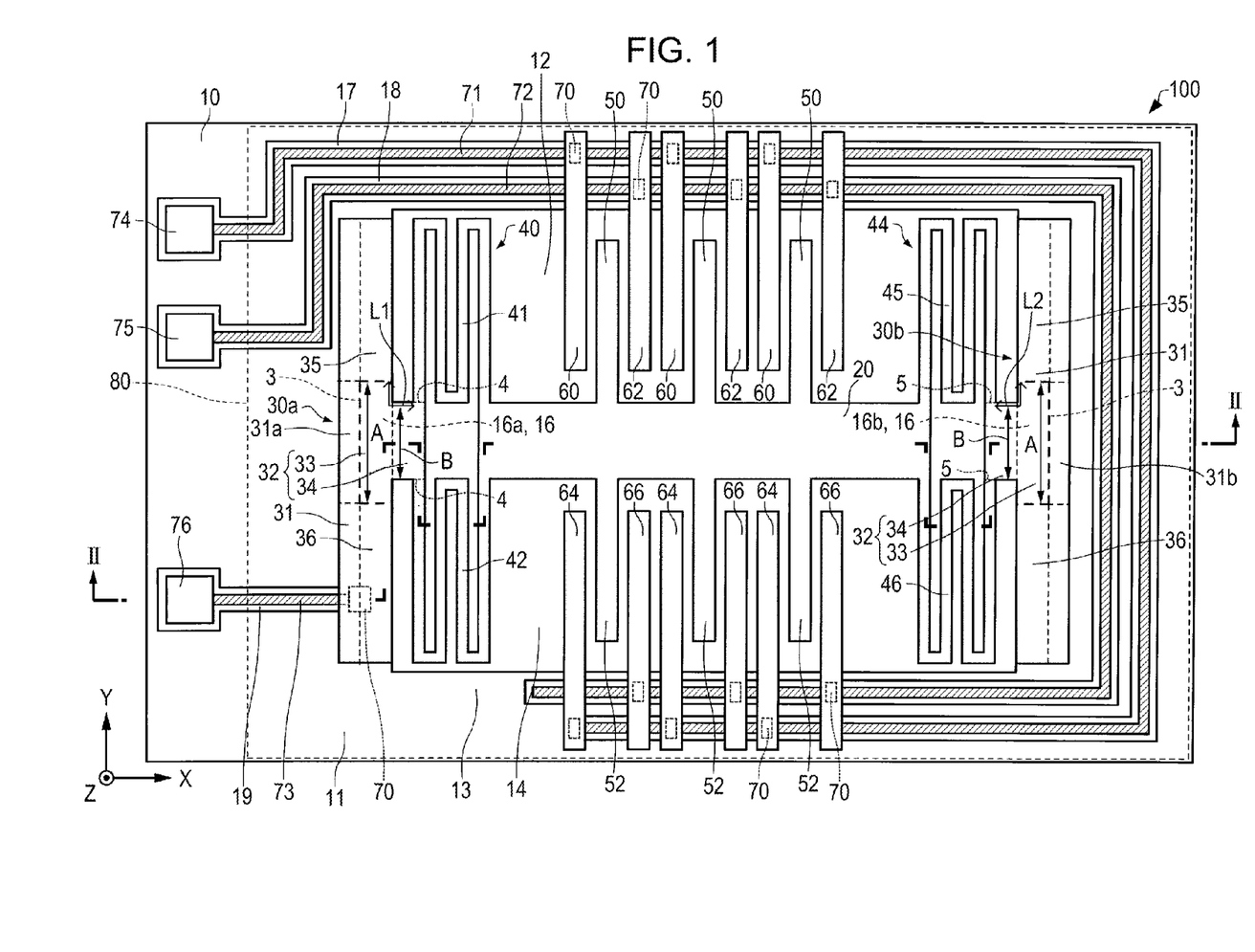
FIG. 1 is a schematic plan view showing a functional element according to the embodiment.
Figure 2:
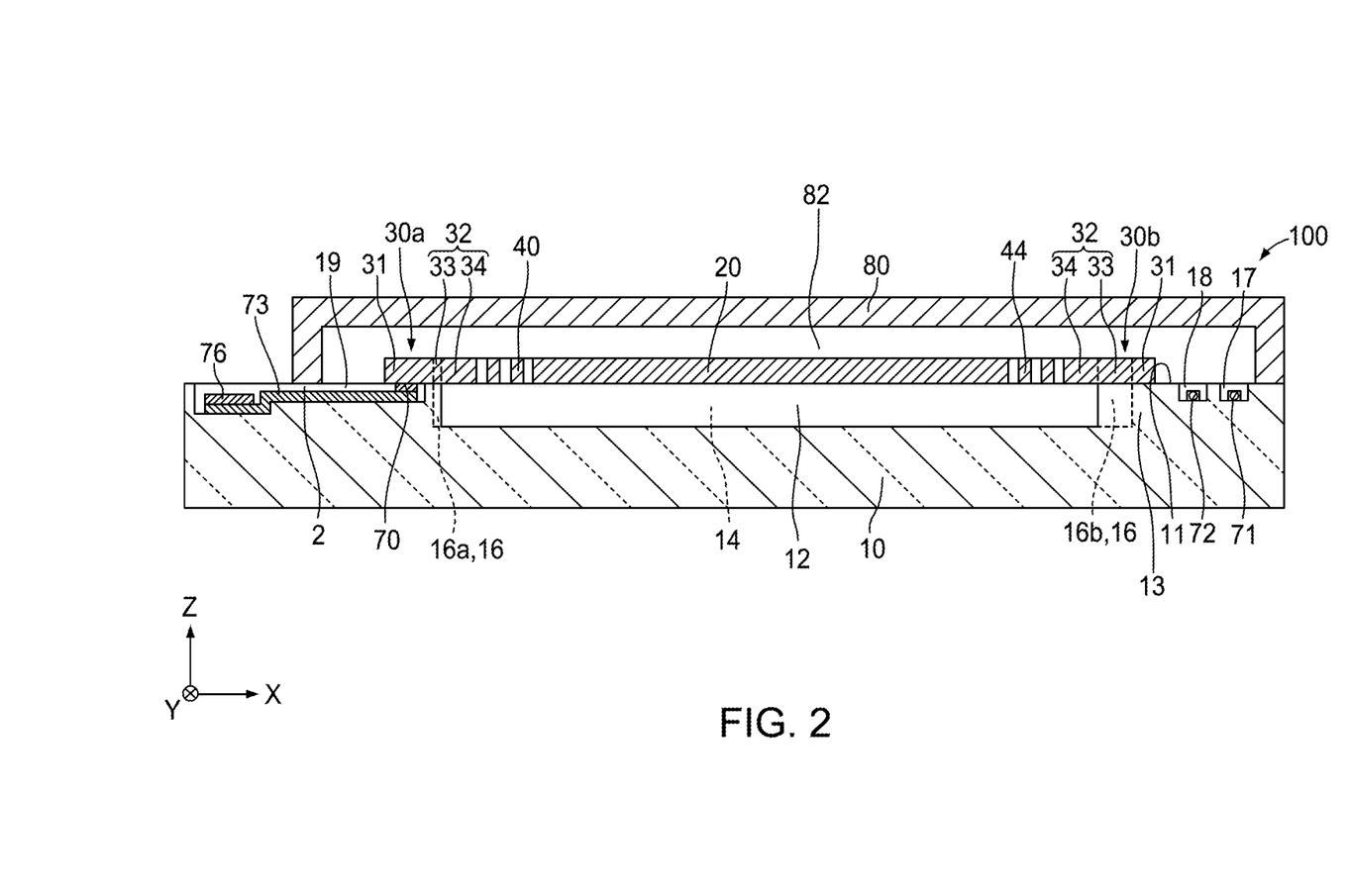
FIG. 2 is a schematic sectional view showing a functional element according to the embodiment.

Firstly, a functional element according to the embodiment will be described with reference to the accompanied drawings. FIG. 1 is a schematic plan view showing a functional element 100 according to the embodiment. FIG. 2 is a sectional view of line II-II in FIG. 1 which shows the functional element 100 according to the embodiment. Further, FIG. 1 and FIG. 2 show an X axis (the first axis), a Y axis (the second axis), and a Z axis (the third axis) as three axes which are orthogonal to each other.

As shown in FIG. 1 and FIG. 2, the functional element 100 includes a substrate 10, a movable body 20, stationary sections 30*a* and 30*b*, elastic sections 40 and 44, movable electrode sections 50 and 52, stationary electrode sections 60, 62, 64, and 66, wirings 71, 72, and 73, pads 74, 75, and 76, and lid body 80. For convenience, the lid body 80 is shown in a see-through manner in FIG. 1. Hereinafter, the functional element 100 is assumed to be a physical quantity sensor. Specifically, an example will be described in which the functional element 100 is an acceleration sensor (MEMS acceleration sensor of capacitance type) that detects acceleration of a horizontal direction (the X axis direction (the first axis direction)).

A material of the substrate 10 is, for example, glass, or silicon. A concave section 12 is provided on the top surface 11 of the substrate 10 (a surface facing toward the +Z axis direction). The substrate 10 includes a wall section that defines the concave section 12. Specifically, the wall section 13 defines a plane shape of the concave section (a shape when seen from the Z axis direction). When seen in the plan view (when seen from the Z axis direction), the wall section 13 surrounds the concave section 12. The concave section 12 includes a receiving section 14 and a cutout section 16.

The receiving section 14 is a space that receives the movable body 20, the elastic sections 40 and 44, and the movable electrode sections 50 and 52 (hereinafter referred to as "the movable body 20 and the like"). Specifically, as shown in FIG. 2, the receiving section 14 forms a cavity 82 that receives the movable body 20 and the like so as to receive the movable body 20 accordingly. The cavity 82 is defined by the substrate 10 and the lid body 80. When seen in the plan view, the receiving section 14 is overlapped with the movable body 20 and the like. In the example shown in FIG. 1, the plane shape of the receiving section 14 is rectangular. The receiving section 14 is continuous to the cutout section 16.

The wall section 13 is provided with the cutout section 16. The cutout section 16 is provided as two sections. For, example, one cutout section 16*a* is provided on the receiving section 14 in the −X axis direction thereof, whereas the other cutout section 16*b* is provided on the receiving section 14 in the +X axis direction. In the example shown, one side of the wall section 13 is hollowed toward the +X axis direction to form the cutout section 16a, and the other side of the wall section 13 is hollowed toward the −X axis direction to form the other cutout section 16b. In the example shown, the plane shape of the cutout section 16 is rectangular. The width (size) of the cutout section 16 in the X axis direction is narrower (smaller) than that of the receiving section 14 in the X axis direction. The width of the cutout section 16 in the second axis direction (the Y axis direction) is narrower than that of the receiving section 14 in the Y axis direction.

The top surface 11 of the substrate 10 is further provided with groove sections 17, 18 and 19. The groove sections 17, 18 and 19 are provided with wirings 71, 72 and 73, and pads 74, 75 and 76, respectively.

Further, in the example as shown in FIG. 2, a side of the substrate 10 which defines the concave section 12 and the groove sections 17, 18 and 19 is orthogonal to the top surface 11. However, the side of the substrate 10 which defines the concave section 12 and the groove sections 17, 18 and 19 may be inclined to the top surface 11.

The movable body 20, the stationary sections 30a and 30b, the elastic sections 40 and 44, and the movable electrode sections 50 and 52 are together integrally formed. For example, one piece of the substrate (a silicon substrate 102, see FIG. 4) is subjected to a patterning process to integrally altogether form the movable body 20, the stationary sections 30a and 30b, the elastic sections 40 and 44, and the movable electrode sections 50 and 52. The material for the movable body 20, the stationary sections 30a and 30b, the elastic sections 40 and 44, and the movable electrode sections 50 and 52 is, for example, a silicon which is subjected to a doping process with impurities such as phosphorus or boron so as to have conductivity. The material of the stationary sections 30a and 30b is different from that of the substrate 10.

The movable body 20 is connected to the elastic sections 40 and 44 and is displaceable along with the X axis direction. Specifically, the movable body 20 is displaced in the X axis direction while elastically deforming the elastic sections 40 and 44, in response to acceleration in the X axis direction. According to such a displacement, gaps between the movable electrode sections 50 and 52 and the stationary electrode sections 60, 62, 64 and 66 change in sizes thereof. In other words, according to such a displacement, capacitances between the movable electrode sections 50 and 52 and the stationary electrode sections 60, 62, 64 and 66 changes in magnitudes thereof. Based on the capacitances, the functional element 100 detects the acceleration in the X axis direction. In the example shown in FIG. 1, the plane shape of the movable body 20 is a rectangular shape having long sides in the X axis.

The first stationary section 30a and the second stationary section 30b are connected to the wall section 13 of the substrate 10. Specifically, the stationary sections 30a and 30b have a bonding section 31 bonded to the substrate 10 and thus is bonded to substrate 10 through the bonding section 31. The plane shape of the bonding section 31 is the same as that of a contact surface between the stationary sections 30a and 30b and the substrate 10. The stationary sections 30a and 30b are fixed on the substrate 10. The first stationary section 30a is located in the −X axis direction with respect to the receiving section 14. The second stationary section 30b is located in the +X axis direction with respect to the receiving section 14. The stationary sections 30a and 30b have an overlap section 32 which overlaps the concave section 12 when seen in the plan view.

The overlap section 32 is spaced with the substrate 10. At least a portion of the overlap section 32 overlaps the cutout section 16 when seen in the plan view. In the example shown, the overlap section 32 includes a first portion 33 overlapping the cutout section 16 and a second portion 34 overlapping the receiving section 14, when seen in the plan view. The first portion 33 is connected to the bonding section 31. The second section 34 is connected to the first portion 33. In the example shown, the plane shape of the first portion 33 and the plane shape of the second portion 34 are rectangular. When seen in the plan view, a width A of the cutout section 16 in the Y axis direction is wider (larger) than a width B of the second portion 34 in the Y axis direction.

The first stationary section 30a and the second stationary section 30b have extension sections 35 and 36 which extend from the first portion 33 of the overlap section 32 in the Y axis direction. In the example shown, the extension section 35 extends from the first portion 33 in the +Y axis direction, and the extension section 36 extends from the first portion 33 in the −Y axis direction. At least a portion of the extension sections 35 and 36 constitutes the bonding section 31. In the example shown, the extension section 35 of the first stationary section 30a and the extension sections 35 and 36 of the second stationary section 30b constitutes the bonding section 31. Except for a portion which overlaps the groove section 19 and a contact section 70, the extension section 36 of the first stationary section 30a constitutes the bonding section 31 when seen in the plan view.

As shown in FIG. 1, the bonding section 31 of the first stationary section 30a has an area 31a which is located in the −X axis direction with respect to the first portion 33 of the overlap section 32. The bonding section 31 of the second stationary section 30b has an area 31b which is located in the +X axis direction with respect to the first portion 33 of the overlap section 32.

The first elastic section 40 extends from the first stationary section 30a, and is capable of stretching and contracting in the X axis direction. Specifically, the first elastic section 40 extends from the second portion 34 of the overlap section 32 of the first stationary section 30a. The first elastic section 40 couples the movable body 20 with the first stationary section 30a. The second elastic section 44 extends from the second stationary section 30b to be capable of stretching and contracting in the X axis direction. Specifically, the second elastic section 44 extends from the second portion 34 of the overlap section 32 of the second stationary section 30b. The second elastic section 44 couples the movable body 20 with the second stationary section 30b.

The first elastic section 40 and the second elastic section 44 is configured to have a predetermined spring constant and to displace the movable body 20 in the X axis direction. In the example shown, the first elastic section 40 is configured to include beams 41 and 42 which reciprocate in the Y axis direction and extend in the X axis direction. The second elastic section 44 is configured to include beams 45 and 46 which reciprocate in the Y axis direction and extend in the X axis direction.

The first movable electrode section 50 and the second movable electrode section 52 extend from the movable body 20 in opposing directions along the Y axis direction. Specifically, the first movable electrode section 50 extends from the movable body 20 in the +Y axis direction. The second movable electrode section 52 extends from the movable body 20 in the −Y axis direction. The movable electrode sections 50 and 52 are arranged as plural pieces in parallel in the X axis direction, respectively. In the example shown, the plane shape of the movable electrode sections 50 and 52 is a rectangular shape having long sides in the Y axis. The movable electrode sections 50 and 52 can be displaced in the X axis according to the displacement of the movable body 20.

The first stationary electrode section 60 and the second stationary electrode section 62 are disposed to face the first movable electrode section 50. Specifically, the first stationary electrode section 60 is disposed to face the first movable electrode section 50 on one side (the −X axis direction) of the first movable electrode section 50. The second stationary electrode section 62 is disposed to face the first movable electrode section 50 on the other side (the +X axis direction) of the first movable electrode section 50. The stationary electrode sections 60 and 62 are connected to the substrate 10, and extend to be disposed along the extending direction (the Y axis direction) of the movable electrode section 50. In the example shown, when seen in the plan view, the stationary electrode sections 60 and 62 extend from a portion which is bonded to the top surface 11 of the substrate 10, and go beyond an outer edge of the concave section 12 so as to further extend to the movable body 20. The plane shape of the stationary electrode sections 60, 62 is a rectangular shape having long sides in the Y axis. The stationary electrode sections 60 and 62 have the same material as that of the movable body 20.

The third stationary electrode section 64 and the fourth stationary electrode section 66 are disposed to face the second movable electrode section 52. Specifically, the third stationary electrode section 64 is disposed to face the second movable electrode section 52 on one side (the −X axis direction) of the second movable electrode section 52. The fourth stationary electrode section 66 is disposed to face the second movable electrode section 52 on the other side (the +X axis direction) of the second movable electrode section 52. The stationary electrode sections 64 and 66 are connected to the substrate 10, and extend in the extending direction (the Y axis direction) of the movable electrode section 52. In the example shown, when seen in the plan view, the stationary electrode sections 64 and 66 extend from a portion which is bonded to the top surface 11 of the substrate 10, and go beyond an edge of the concave section 12 to further extend to the movable body 20. The plane shape of the stationary electrode sections 64 and 66 is a rectangular shape having long sides in the Y axis. The stationary electrode sections 64 and 66 have the same material as that of the movable body 20.

The first wiring 71 is provided on the substrate 10. Specifically, the first wiring 71 is disposed on the groove section 17 which is formed on the top surface 11 of the substrate 10. The first wiring 71 is electrically connected to the stationary electrode sections 60 and 64 through the contact section 70. In other words, the stationary electrode sections 60 and 64 are electrically connected to each other.

The second wiring 72 is provided on the substrate 10. Specifically, the second wiring 72 is disposed on the groove section 18 which is formed on the top surface 11 of the substrate 10. The second wiring 72 is electrically connected to the stationary electrode sections 62 and 66 through the contact section 70. In other words, the stationary electrode sections 62 and 66 are electrically connected to each other.

The third wiring 73 is provided on the substrate 10. Specifically, the third wiring 73 is disposed on the groove section 19 which is formed on the top surface 11 of the substrate 10. The third wiring 73 is electrically connected to the first stationary section 30*a* through the contact section 70. In the example shown, the contact section 70 that electrically connects the third wiring 73 with the first stationary section 30*a* is connected to the extension section 36 of the first stationary section 30*a*.

The pads 74, 75 and 76 are provided on the substrate 10. Specifically, the pads 74, 75 and 76 are respectively disposed on the groove sections 17, 18 and 19 to be connected to the wirings 71, 72 and 73. When in the plan view, the pads 74, 75 and 76 are located not to be overlapped with the lid body 80. In the example shown, the pads 74, 75 and 76 are arranged in parallel in the Y axis direction.

The materials for the wirings 71, 72 and 73, the pads 74, 75 and 76, and the contact section 70 (hereinafter, referred to as "the wiring 71 and the like") include, for example, indium tin oxide (ITO), aluminum, gold, platinum, titanium, tungsten, and chrome. When the material of the wiring 71 and the like is transparent electrode material such as ITO, and also when the substrate 10 is transparent, foreign matter which is present on the wiring 71 and the like can be easily and visually identified when seen from the bottom surface (a surface opposite to the top surface 11) of the substrate 10.

The lid body 80 is provided on the substrate 10. The substrate 10 and the lid body 80 constitute a package. As shown in FIG. 2, the substrate 10 and the lid body 80 form a cavity 82. The movable body 20 and the like are received in the cavity 82. As shown in FIG. 2, a gap 2 between the third wiring 73 and the lid body 80 (a gap between the lid body 80 and the substrate 10, and the gap formed of the groove section 19) may be filled with an adhesive member (not shown) and the like. In this case, the cavity 82 may be sealed to be in an inert gas (for example Nitrogen gas) environment. The material of the lid body 80 includes, for example, silicon or glass.

The functional element 100 uses the pads 74 and 76 to be capable of measuring a capacitance between the first movable electrode section 50 and the first stationary electrode section 60, and a capacitance between the second movable electrode section 52 and the third stationary electrode section 64. Further, the functional element 100 uses the pads 75 and 76 to be capable of measuring a capacitance between the first movable electrode section 50 and the second stationary electrode section 62, and a capacitance between the second movable electrode section 52 and the fourth stationary electrode section 66. As described above, the functional element 100 individually measures and performs a differential detection on (using so called the differential detection method) the capacitance between the movable electrode sections 50 and 52 and the stationary electrode sections 60 and 64, and the capacitance between the movable electrode sections 50 and 52 and the stationary electrode sections 62 and 66, and thereby can detect the acceleration.

The functional element 100 has characteristics as follows, for example.

In the functional element 100, the concave section 12 includes the cutout section 16 which is provided on the wall section 13, and the stationary sections 30*a* and 30*b* include the overlap section 32 which is spaced with the substrate 10 and overlaps the concave section 12 when in the plan view. At least a portion of the overlap section 32 overlaps the cutout section 16 when seen in the plan view. The elastic sections 40 and 44 extend from the overlap section 32. For this reason, in the functional element 100, when seen in the plan view, a distance (the shortest length) L1 from a boundary 3 between the bonding section 31 and the overlap section 32 to a boundary 4 between the overlap section 32 and the first elastic section 40 can be made longer while the distance passes through the overlap section 32 of the first stationary section 30*a*, compared with a case where the cutout section 16*a* is not provided. Therefore, when a stress occurs on the bonding section 31 of the first stationary section 30a due to a difference between a linear expansion coefficient of the substrate 10 and a linear expansion coefficient of the first stationary section 30a, it is possible to decrease an influence that the stress may exert upon the first elastic section 40. Similarly to this, in the functional element 100, when seen in the plan view, a distance (the shortest length) L2 from a boundary 3 between the bonding section 31 and the overlap section 32 to a boundary 5 between the overlap section 32 and the second elastic section 44 can be made longer while the distance passes through the overlap section 32 of the second stationary section 30b, compared with a case where the cutout section 16b is not provided. Therefore, when a stress occurs on the bonding section 31 of the second stationary section 30b due to a difference between a linear expansion coefficient of the substrate 10 and a linear expansion coefficient of the second stationary section 30b, it is possible to decrease an influence that the stress may exert upon the second elastic section 44. As a result, the functional element 100 can have an excellent temperature characteristic. When seen in the plan view, the distance L1 between the boundary 3 and the boundary 4 in a case where the distance L1 passes through the overlap section 32 of the first stationary section 30a, and the distance L2 between the boundary 3 and the boundary 5 in a case where the distance L2 passes through the overlap section 32 of the second stationary section 30b are, for example, greater than or equal to 20 μm.

For example, when the cutout section is not provided and the width of the second potion of the overlap section in the X axis direction is increased to lengthen the distance from the boundary between the bonding section and the overlap section to the boundary between the overlap section and the elastic section, there may be a case where it is difficult to miniaturize the functional element. It is possible to miniaturize the functional element 100 by provision of the cutout section 16.

In the functional element 100, the stationary sections 30a and 30b includes the extension sections 35 and 36 which extend from the overlap section 32 in the Y axis direction when seen in the plan view. For this reason, when seen in the plan view, the stationary sections 30a and 30b can have a large area of the bonding section 31 and can also be further stably fixed to the substrate 10, compared with a case where the extension sections 35 and 36 are not provided.

In the functional element 100, the material of the substrate 10 is, for example, glass, and the material of the stationary sections 30a and 30b is, for example, silicon. For this reason, the silicon substrate is subjected to the machining process so that the movable body 20 may be formed, and the silicon substrate for forming the movable body 20 can be bonded to the substrate 10 through an anodic bonding. Further, in the functional element 100, even in the case that the material of the substrate 10 is different from that of the stationary sections 30a and 30b, as described above, when a stress occurs on the bonding section 31 of the stationary sections 30a and 30b due to a difference between a linear expansion coefficient of the substrate 10 and a linear expansion coefficient of the stationary sections 30a and 30b, it is possible to decrease an influence that the stress may exert upon the elastic sections 40 and 44.

In the functional element 100, when seen in the plan view, the width A of the cutout sections 16 in the Y axis direction is wider than the width B of the second portion 34 of the overlap section 32 in the Y axis direction. For this reason, in the functional element 100, when seen in the plan view, the distance L1 between the boundary 3 and the boundary 4 in a case where the distance L1 passes through the overlap section 32 of the first stationary section 30a, and the distance L2 between the boundary 3 and the boundary 5 in a case where the distance L2 passes through the overlap section of the second stationary section 30b can be made longer, compared with a case where the width A is narrower than the width B. Therefore, when a stress occurs on the bonding section 31 due to a difference between a linear expansion coefficient of the substrate 10 and a linear expansion coefficient of the stationary sections 30a and 30b, it is possible to decrease an influence that the stress may exert upon the elastic sections 40 and 44.

In the functional element 100, the contact section 70 that electrically connects the third wiring 73 with the first stationary section 30a is connected to the extension section 36 of the first stationary section 30a. For this reason, in the functional element 100, when a stress occurs on the first stationary section 30a due to a connection of the contact section 70, it is possible to further decrease an influence that the stress may exert upon the first elastic section 40, compared with, for example, the contact section for electrically connecting the third wiring with the first stationary section connected to the overlap section closer to the elastic section.

2. Manufacturing Method of Functional Element

Figure 3:
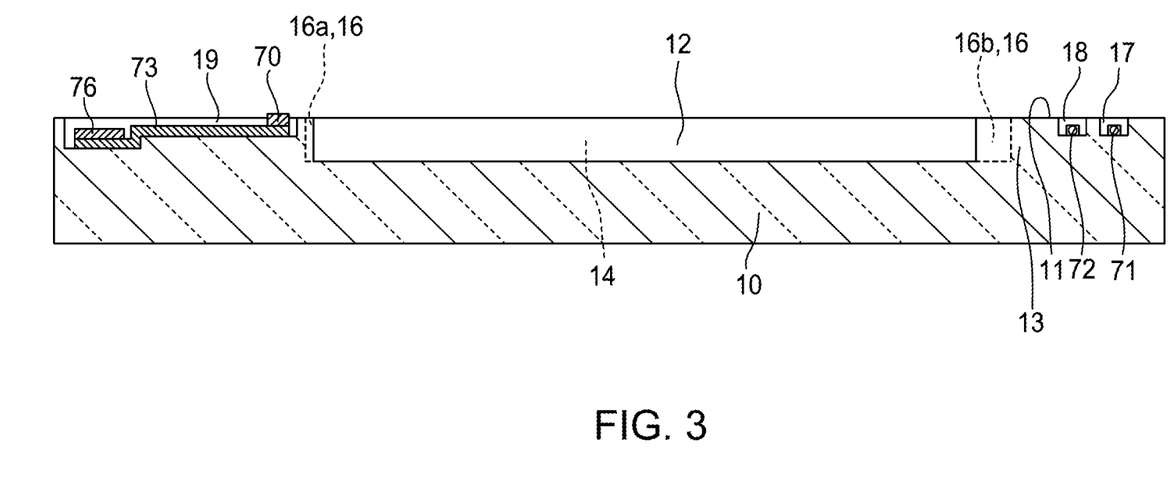
FIG. 3 is a schematic sectional view showing a manufacturing process of the functional element according to the embodiment.
Figure 4:
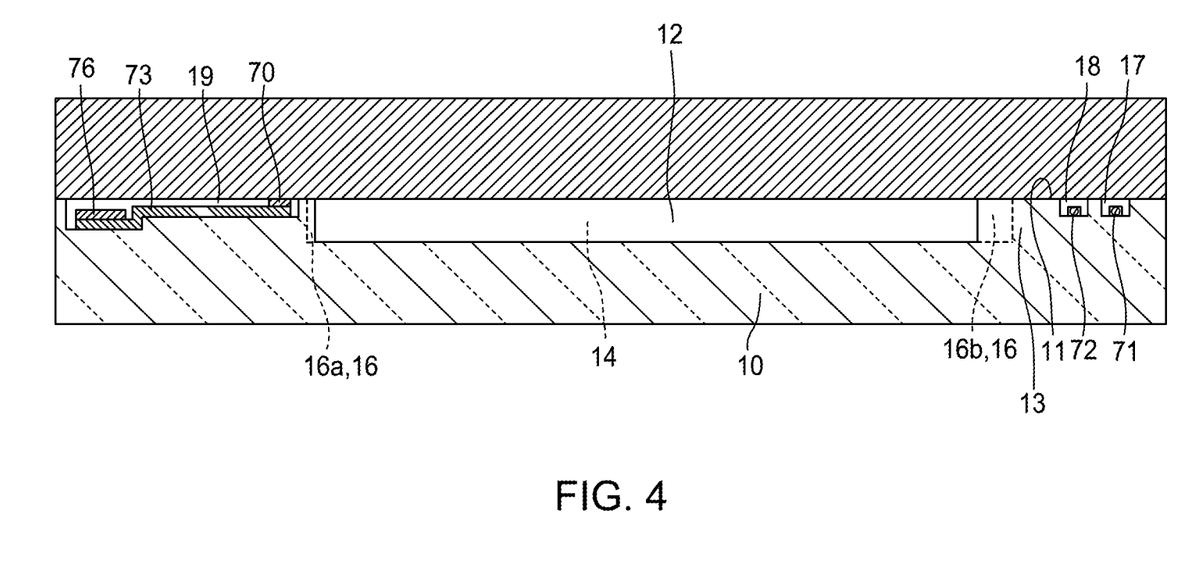
FIG. 4 is a schematic sectional view showing a manufacturing process of the functional element according to the embodiment.
Figure 5:
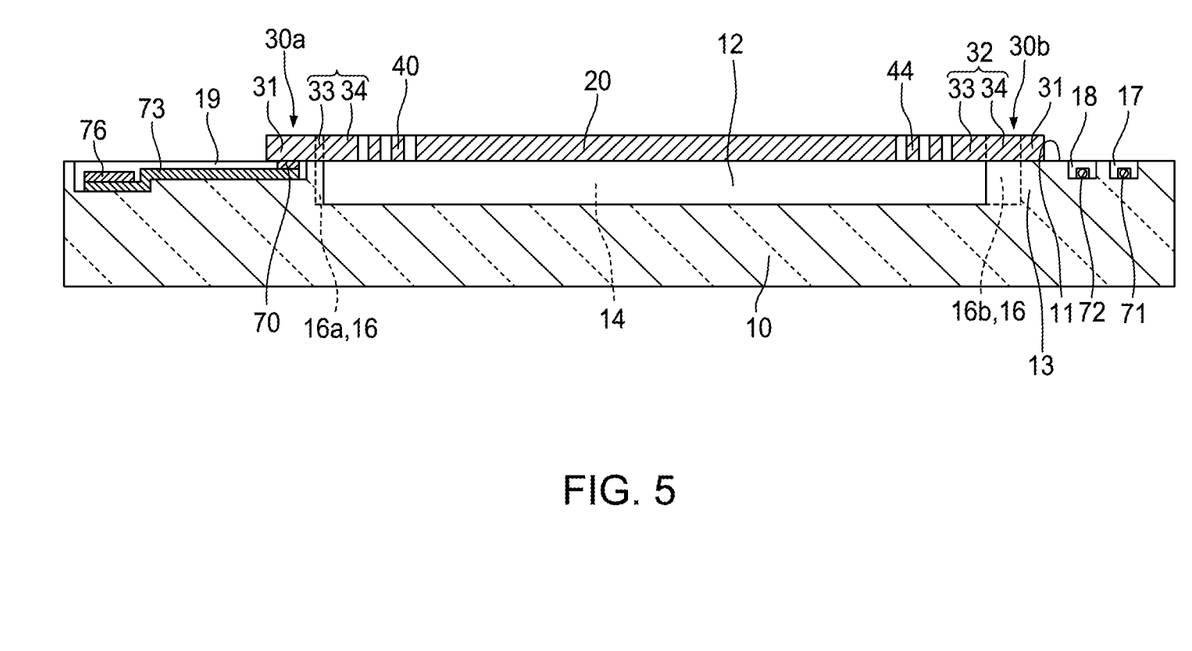
FIG. 5 is a schematic sectional view showing a manufacturing process of the functional element according to the embodiment.

Hereinafter, a manufacturing method of the functional element according to the embodiment will be described with reference to the accompanied drawings. FIG. 3, FIG. 4 and FIG. 5 are schematic sectional views showing a manufacturing process of the functional element 100 according to the embodiment, and the views correspond to FIG. 2.

As shown in FIG. 3, for example, the glass substrate is subjected to the patterning process (specifically, by performing a patterning based on photolithography and an etching) to form the concave section 12 having the receiving section 14 and the cutout section 16, and to further form the groove sections 17, 18 and 19. With this process used, it is possible to obtain the substrate 10 in which the concave section 12, and the groove sections 17, 18 and 19 are formed.

Further, the wirings 71, 72 and 73 are formed in the groove sections 17, 18 and 19, respectively. Subsequently, the contact section 70 is formed on the wirings 71, 72 and 73. Still subsequently, the pads 74, 75 and 76 are formed to be connected to the wirings 71, 72 and 73, respectively. Films are formed using, for example, a spattering method, or chemical vapor deposition (CVD) and the patterning process is performed to thereby form the contact section 70, the wirings 71, 72 and 73, and the pads 74, 75 and 76. The process for forming the contact section 70 and the process for forming the pads 74, 75 and 76 carry on regardless of the order thereof.

It is preferable that the contact section 70 is formed to protrude upwardly higher than the top surface 11 of the substrate 10. With this configuration, the contact section 70 can be reliably contacted to the silicon substrate 102 to be described later. In this case, the contact section 70 may be deformed during, for example, a process for bonding the silicon substrate 102 to the substrate 10.

As shown in FIG. 4, for example, the silicon substrate 102 is bonded to the substrate 10. The bonding between the substrate 10 and the silicon substrate 102 is performed using, for example, an anodic bonding. Therefore, it is possible that the silicon substrate 102 is strongly bonded to the substrate 10.

As shown in FIG. 5, for example, a grinding machine is used to grind and thin the silicon substrate 102. After that, the thinned silicon substrate is subjected to the patterning process to have a predetermined shape, and thus the movable body 20, and the stationary sections 30a and 30b, the elastic sections 40 and 44, and the movable electrode sections and 52 are integrally formed. Further, in this process, the stationary electrode sections 60, 62, 64 and 66 are formed. The etching of the patterning according to this process may be performed using the Bosch method.

As shown in FIG. 2, the lid body 80 is bonded to the substrate 10, and the movable body 20 and the like are received in a cavity 82 formed by the substrate 10 and the lid body 80. The bonding between the substrate 10 and the lid body 80 is performed using, for example, the anodic bonding. Therefore, it is possible that the lid body 80 is strongly bonded to the substrate 10. This process may be performed in an inert gas environment to be able to fill the cavity 82 with the inert gas.

With the process described above, the functional element 100 is manufactured.

3. Modification Example 3.1. First Modification Example

Figure 6:
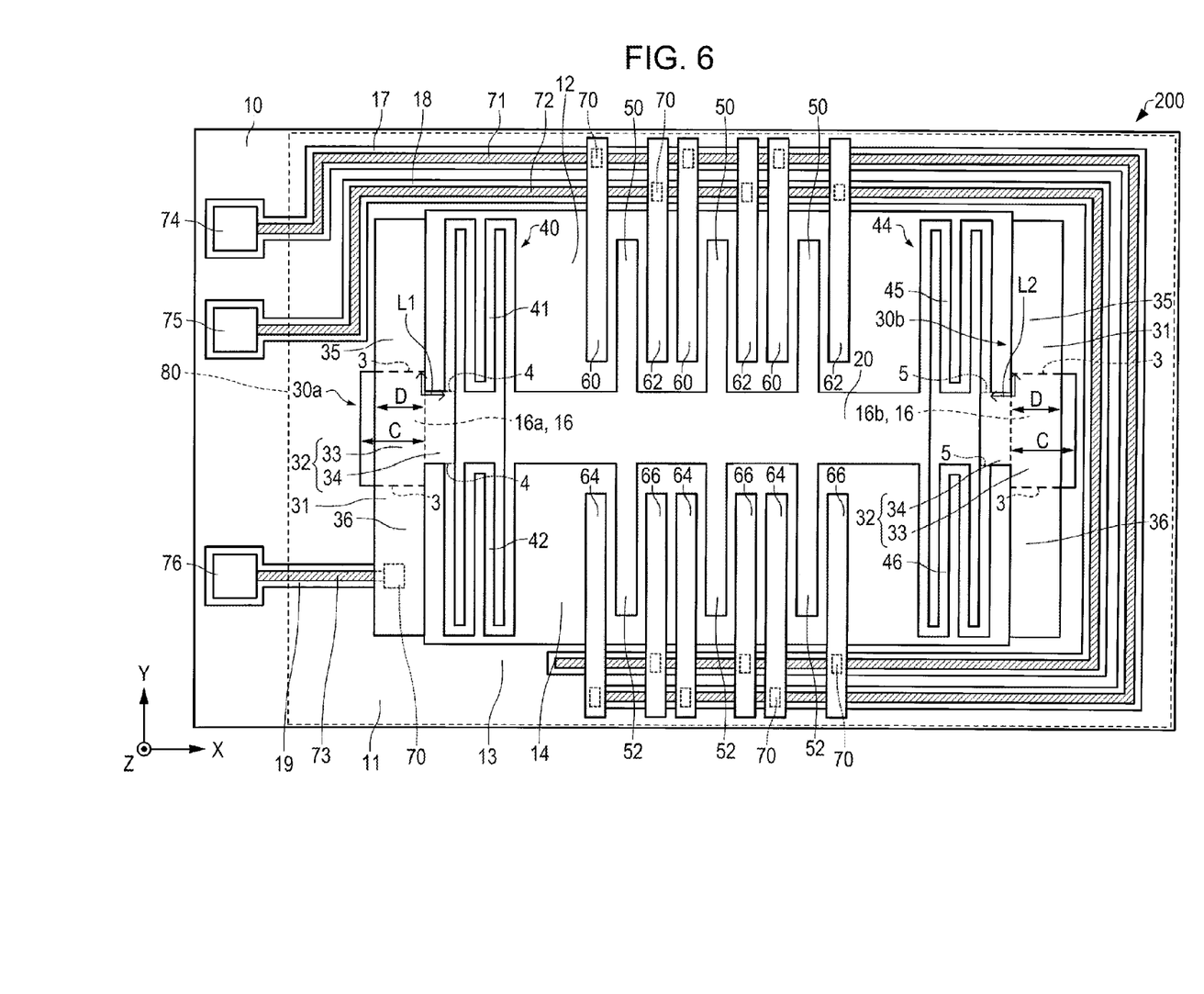
FIG. 6 is a schematic plan view showing a functional element according to the first modification example of the embodiment.

Hereinafter, a functional element according to the first modification example of the embodiment will be described with reference to the accompanied drawings. FIG. 6 is a schematic plan view showing a functional element 200 according to the first modification example of the embodiment. In FIG. 6, and in FIG. 7 to be described later, the lid body 80 is shown in a see-through manner. Further, FIG. 6 and FIG. 7 to be described later show an X axis (the first axis), a Y axis (the second axis), and a Z axis (the third axis) as three axes which are orthogonal to each other.

In the functional element 200 according to the first modification example of the embodiment, the like numbers will be assigned to the members having the same function as those in the functional element 100 according to the embodiment and the detailed description thereof will not be repeated. The same also applies to the functional element 300 according to the second modification example of the embodiment.

In the functional element 100 describe above, when seen in the plan view as shown in FIG. 1, the width of the cutout section 16 in the X axis direction is the same as that of the first portion 33 of the overlap section 32 in the X axis direction, the bonding section 31 of the first stationary section 30a has an area 31a, and the bonding section 31 of the second stationary section 30b has an area 31b.

Whereas, in the functional element 200, when seen in the plan view as shown in FIG. 6, the width C of the cutout section 16 in the first axis direction (the X axis direction) is wider than the width D of a portion (the first portion) 33 overlapping the cutout section 16 in the X axis direction when seen in the plan view, the first portion 33 being a part of the overlap section 32. For this reason, the bonding section of the first stationary section 30a does not include an area which is located in the first portion 33 of the overlap section 32 in the −X axis direction. Similarly, the bonding section 31 of the second stationary section 30b does not include an area which is located in the first portion 33 of the overlap section 32 in the +X axis direction. Therefore, in the functional element 200, when a stress occurs on the bonding section 31 due to a difference between a linear expansion coefficient of the substrate 10 and a linear expansion coefficient of the stationary sections 30a and 30b, it is possible to decrease an influence that the stress may exert upon the elastic sections 40 and 44, for example, compared with the case of the functional element 100.

3.2. Second Modification Example

Figure 7:
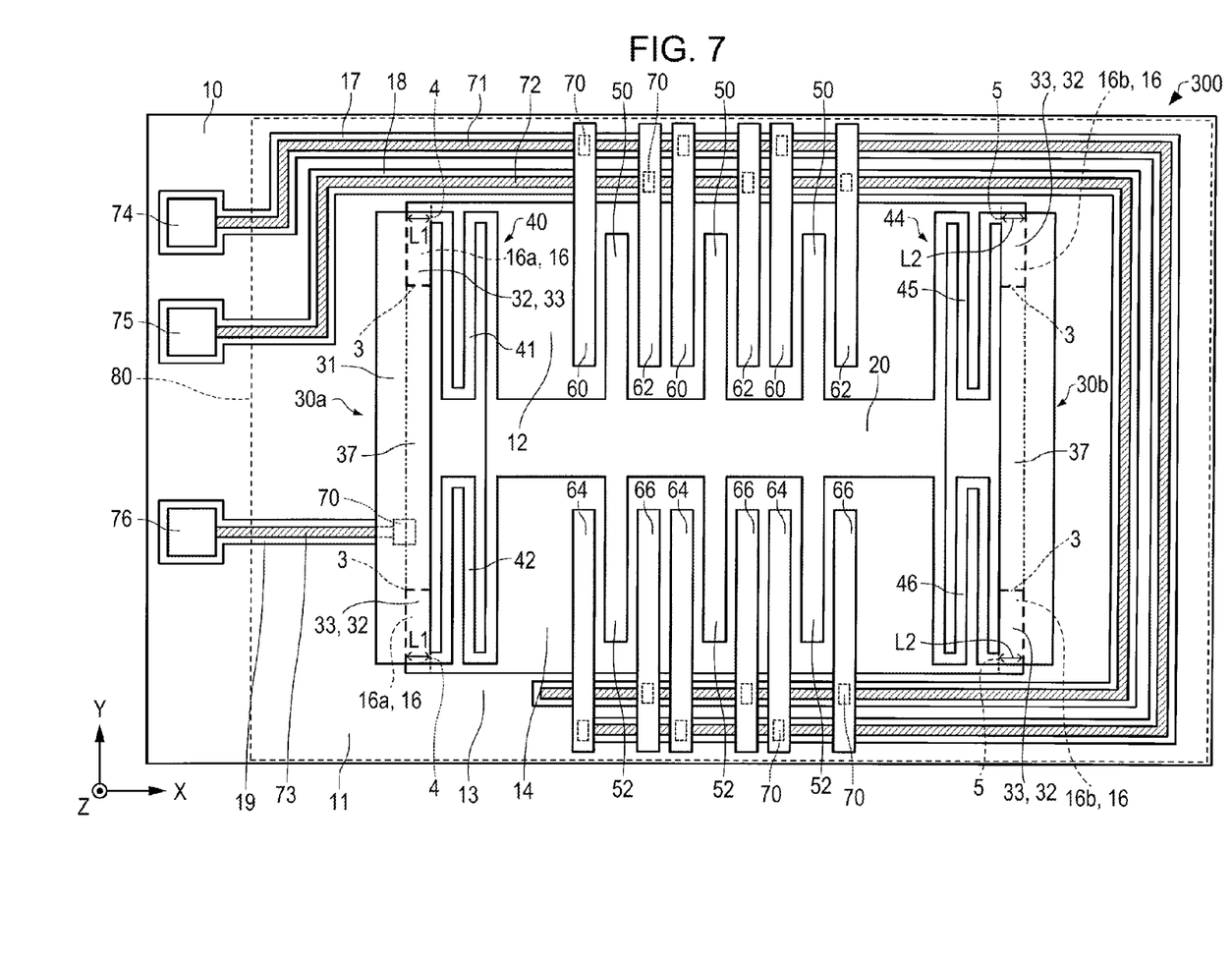
FIG. 7 is a schematic plan view showing a functional element according to the second modification example of the embodiment.

Hereinafter, a functional element according to the second modification example of the embodiment will be described with reference to the accompanied drawings. FIG. 7 is a schematic plan view showing the functional element 300 according to the second modification example of the embodiment.

In the functional element 100 described above, as shown in FIG. 1, the first stationary section 30a and the second stationary section 30b include the overlap section 32 in the central portion in the Y axis direction.

Whereas, in the functional element 300, as shown in FIG. 7, the first stationary section 30a and the second stationary section 30b include the overlap section 32 in the end portion in the Y axis direction. When seen in a plan view, the cutout section 16a overlapped with the first stationary section 30a is provided as two pieces. Further, when seen in a plan view, the cutout section 16b overlapped with the second stationary section 30b is provided as two pieces. In the example shown, the overlap section 32 disposed on the end portion of the first stationary section 30a in the +Y axis direction is connected to the beam 41 of the first elastic section 40, and the overlap section 32 disposed on the end portion of the first stationary section 30a in the −Y axis direction is connected to the beam 42 of the first elastic section 40. Further, the overlap section 32 disposed on the end portion of the second stationary section 30b in the +Y axis direction is connected to the beam 45 of the second elastic section 44, and the overlap section 32 disposed on the end portion of the second stationary section 30b in the −Y axis direction is connected to the beam 46 of the second elastic section 44. In the example shown, the overlap section is configured to include the first portion 33 overlapping the cutout section 16 when seen in the plan view.

In the functional element 300, the first stationary section 30a includes an extension section 37 which extends in the Y axis direction from the overlap section 32 disposed on the end portion of the +Y axis direction to the overlap section 32 disposed on the end of the −Y axis direction. Similarly, the second stationary section 30b includes an extension section 37 which extends in the Y axis direction from the overlap section 32 disposed on the end portion of the +Y axis direction to the overlap section 32 disposed on the end portion of the −Y axis direction.

Similarly to the functional element 100, the functional element 300 can have an excellent temperature characteristic.

As shown in the functional element 200 in FIG. 6, also in the functional element 300, the width of the cutout section 16 in the X axis direction may be wider than width of the first portion 33 of the overlap section 32 in the X axis direction.

4. Electronic Apparatuses

Hereinafter, electronic apparatuses according to the embodiment will be described with reference to the accompanied drawings. The electronic apparatus according to the embodiment includes the functional element according to one aspect of the invention. Hereinafter, an electronic apparatus including the functional element 100 as a functional element according to one aspect of the invention will be described.

Figure 8:
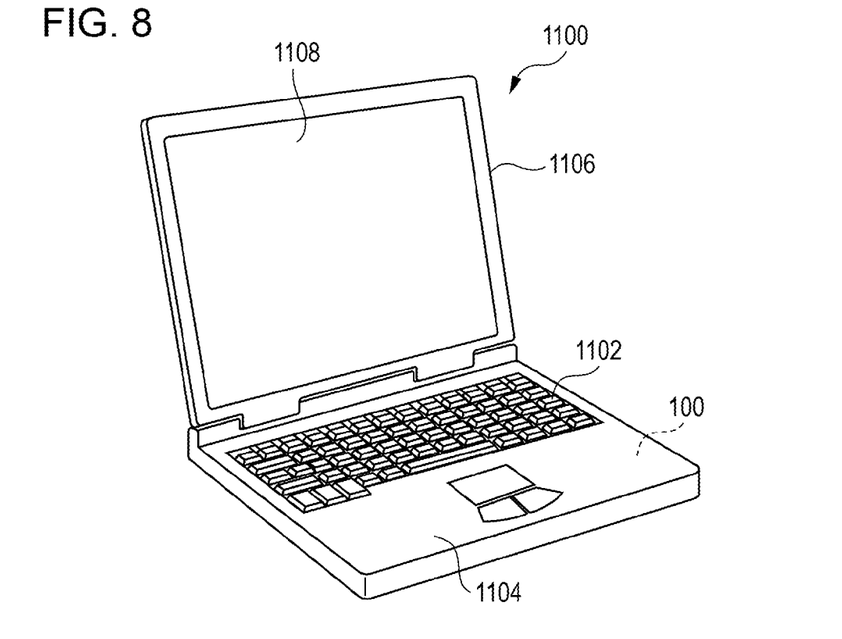
FIG. 8 is a schematic perspective view showing an electronic apparatus according to the embodiment.

FIG. 8 is a schematic perspective view showing a mobile type (or notebook type) personal computer 1100 as the electronic apparatus according to the embodiment.

As shown in FIG. 8, the personal computer 1100 is configured to include a main body section 1104 having a keyboard 1102, and a display unit 1106 having a display section 1108. The display unit 1106 is rotatably supported to the main body section 1104 through a hinge structure section.

Such a personal computer 1100 includes the built-in functional element 100.

Figure 9:
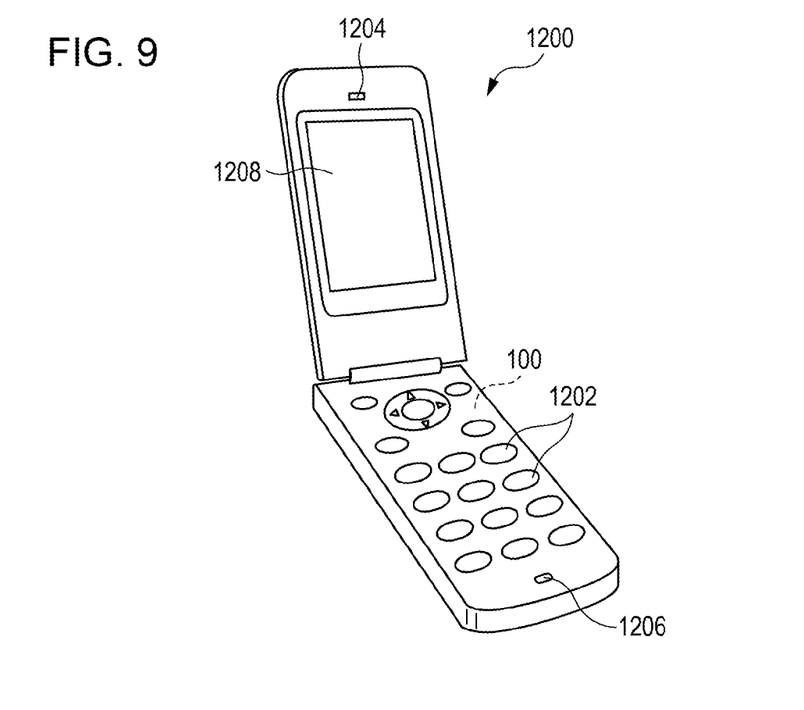
FIG. 9 is a schematic perspective view showing an electronic apparatus according to the embodiment.

FIG. 9 is a schematic perspective view showing a mobile phone (also including PHS) 1200 as the electronic apparatus according to the embodiment.

As shown in FIG. 9, the mobile phone 1200 includes plural operating buttons 1202, an earpiece 1204, and a mouthpiece 1206. A display section 1208 is disposed between the operating button 1202 and the earpiece 1204.

Such a mobile phone 1200 includes the built-in functional element 100.

Figure 10:
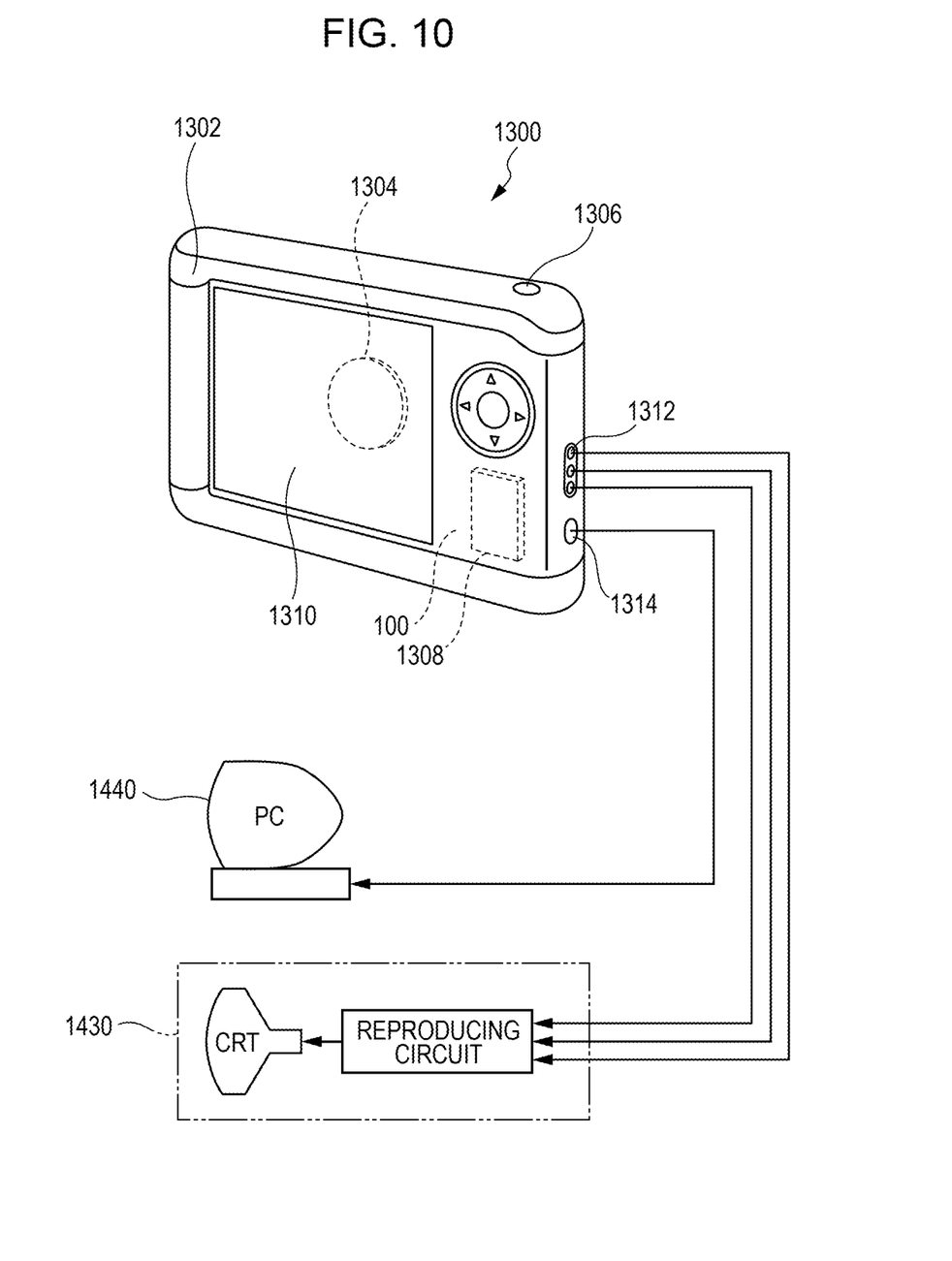
FIG. 10 is a schematic perspective view showing an electronic apparatus according to the embodiment.

FIG. 10 is a schematic perspective view showing a digital still camera 1300 as the electronic apparatus according to the embodiment. Further, in FIG. 10, a connection with an external device is also briefly shown.

Generally, in a typical camera, a light image of a subject causes a silver salt photographic film to be exposed to light, whereas the digital still camera 1300 performs a photoelectric conversion on a light image of a subject using an imaging element such as a charge coupled device (CCD) so as to generate an imaging signal (an image signal).

A display section 1310 is provided on the rear surface of the case (body) 1302 in the digital still camera 1300 and is configured to perform a displaying process based on the imaging signal generated by the CCD. Further, the display section 1310 functions as a finder displaying a subject as an electronic image.

Further, a light receiving section 1304 including optical lenses (imaging optical system), CCD or the like is provided on the front side (rear side in the drawing) of the case 1302.

If a photographer notices a subject image displayed on the display section 1310 and presses the shutter button 1306, an imaging signal of the CCD at that time is transmitted to and stored in a memory 1308.

Further, a video signal output terminal 1312 and an input-output terminal 1314 for data communication are provided on a side of the case 1302 in the digital still camera 1300. Further, the video signal output terminal 1312 may be connected with a television monitor 1430, and the input-output terminal 1314 for data communication may be connected with a personal computer 1440, respectively, if necessary. Further, a configuration is provided in which a predetermined operation causes the imaging signal stored in the memory 1308 to be output to the television monitor 1430 or the personal computer 1440.

Such a digital still camera 1300 includes the built-in functional element 100.

The electronic apparatuses 1100, 1200, and 1300 include the functional element 100 to thereby be capable of having an excellent temperature characteristic.

In addition to the personal computer (the mobile type personal computer) as shown in FIG. 8, the mobile phone as shown in FIG. 9, and the digital still camera as shown in FIG. 10, the electronic apparatuses having the functional element 100 may be applied to for example, an ink jet type discharging device (for example, an ink jet printer), a laptop type personal computer, a television, a video camera, a video tape recorder, various type navigation devices, a pager, an electronic notebook (also including a communicative function), an electronic dictionary, an electronic calculator, an electronic game device, a head mount display, a word processor, a work station, a picturephone, a television monitor for crime prevention, electronic binoculars, a POS terminal, medical equipment (for example, electronic thermometer, sphygmomanometer, a blood glucose meter, an electrocardiogram measurement device, ultrasonic diagnostic equipment, or an electronic endoscope), a fishfinder, various measuring equipment, instruments (e.g., instruments of a vehicle, a plane, a rocket and a ship), a posturing control of a robot or the human body, a flight simulator, and the like.

5. Mobile Entity

Hereinafter, a mobile entity according to the embodiment will be described with reference to the accompanied drawings. The mobile entity according to the embodiment includes the functional element according to one aspect of the invention. Hereinafter, the mobile entity including the functional element 100 as the functional element according to one aspect of the invention will be described.

Figure 11:
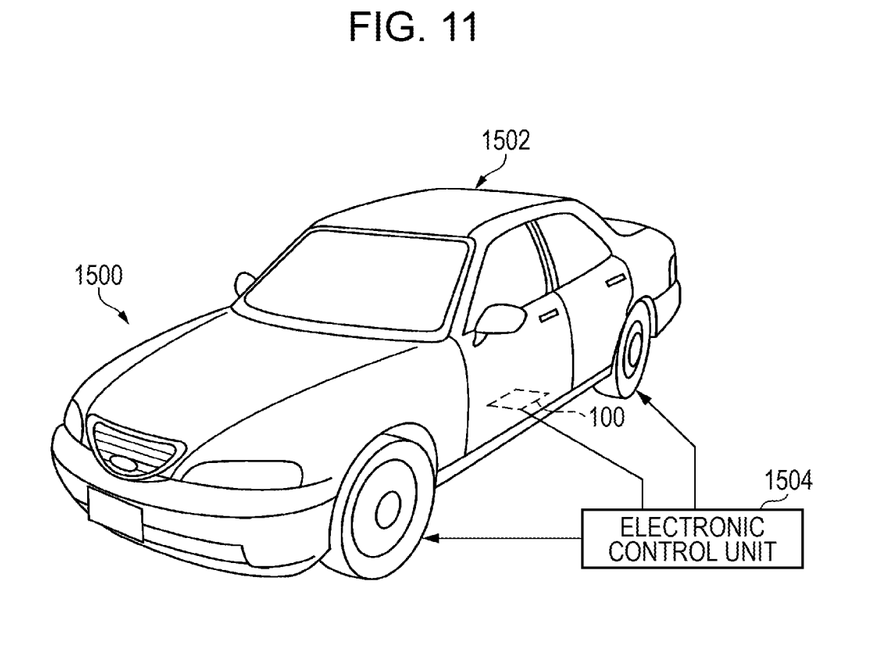
FIG. 11 is a schematic perspective view showing a mobile entity according to the embodiment.

FIG. 11 is a schematic perspective view showing a car 1500 as a mobile entity according to the embodiment.

The car 1500 includes the built-in functional element 100. Specifically, as shown in FIG. 11, the car body 1502 of the car 1500 is provided with an electronic control unit (ECU) 1504 mounted thereon in which the functional element 100 for detecting the acceleration of the car 1500 is built therein to control an output of the engine. Besides, the functional element 100 may be widely applied to a control unit for posturing of a car body, an antilock brake system (ABS), an air bag, a tire pressure monitoring system (TPMS), and the like.

The car 1500 includes the functional element 100 to thereby be capable of having an excellent temperature characteristic.

The invention is not limited to the embodiments describe above, but may include various types of modification examples without departing from the scope of the invention.

For example, the above embodiments describe a case where the functional element is an acceleration sensor that detects the acceleration (a physical quantity sensor) in the X axis direction. However, the functional element according to one aspect of the invention may be an acceleration sensor that detects the acceleration in the Y axis direction, or in the vertical direction (the Z axis direction). Further, the functional element according to one aspect of the invention is not limited to the acceleration sensor, but may be, for example, a gyro sensor that detects an angular velocity. Further, the functional element according to one aspect of the invention may be an element such as a micro electro mechanical systems (MEMS) vibrator other than a sensor such as the acceleration sensor and the angular sensor.

Further, the above embodiments describe that, as three axes, the first axis, the second axis and the third axis are orthogonal to each other. However, the first axis, the second axis, and the third axis may not be orthogonal to each other, but may intersect with each other as three axes.

The embodiments and the modification examples described above are only examples and the invention is not limited thereto. For example, any combination may be appropriately and selectively formed from each of the embodiments and each of the modification examples.

The invention includes configurations (for example, configurations having the same function, the same way, and the same result, or configurations having the same object and the same advantages) substantially the same as the configuration described in the embodiments of the invention. Furthermore, the invention includes configurations obtained by replacing a non-essential part of the configuration described in the embodiments of the invention. Furthermore, the invention includes configurations capable of exerting the same functional effects and configurations capable of achieving the same object as the configuration described in the embodiments of the invention. Furthermore, the invention includes configurations obtained by adding technologies known to the public to the configuration described in the embodiments of the invention.

What is claimed is:

1. A functional element comprising:
a substrate;
a stationary member that is spaced apart from the substrate;
a wall that is provided between the substrate and the stationary member;
an elastic member that extends from the stationary member;
a movable body that is connected to the elastic member;
a movable electrode that is connected to the movable body; and
a stationary electrode that is connected to the substrate and that faces the movable electrode,
wherein the wall includes a cutout,
the stationary member includes an overlap area which overlaps the cutout in a plan view, and
the elastic member extends from the overlap area of the stationary member in a first axis direction.

2. The functional element according to claim 1,
wherein the stationary member includes an extension section which extends from the overlap area in a second axis direction which intersects with the first axis direction in the plan view.

3. The functional element according to claim 2,
wherein a width of the cutout in the first axis direction is wider than a width of the overlap area in the cutout in the first axis direction in the plan view.

4. The functional element according to claim 2, wherein:
the substrate has a first area that faces the movable body in the plan view,
the overlap area has second and third areas, the second area overlaps with the cutout in the plan view, and the third area overlaps with the first area in the plan view, and
a width of the cutout in a second axis direction which intersects with the first axis direction is wider than a width of the third area in the second axis direction.

5. The functional element according to claim 1,
wherein a width of the cutout in the first axis direction is wider than a width of the overlap area in the first axis direction in the plan view.

6. The functional element according to claim 5, wherein:
the substrate has a first area that faces the movable body in the plan view,
the overlap area has second and third areas, the second area overlaps with the cutout in the plan view, and the third area overlaps with the first area in the plan view, and
a width of the cutout in a second axis direction which intersects with the first axis direction is wider than a width of the third area in the second axis direction.

7. The functional element according to claim 1,
wherein a material of the substrate is glass, and a material of the stationary member is silicon.

8. The functional element according to claim 7, wherein:
the substrate has a first area that faces the movable body in the plan view,
the overlap area has second and third areas, the second area overlaps with the cutout in the plan view, and the third area overlaps with the first area in the plan view, and
a width of the cutout in a second axis direction which intersects with the first axis direction is wider than a width of the third area in the second axis direction.

9. The functional element according to claim 1, wherein:
the substrate has a first area that faces the movable body in the plan view,
the overlap area has second and third areas, the second area overlaps with the cutout in the plan view, and the third area overlaps with the first area in the plan view, and
a width of the cutout in a second axis direction which intersects with the first axis direction is wider than a width of the third area in the second axis direction.

10. An electronic apparatus comprising:
the functional element according to claim 1.

11. A mobile entity comprising:
the functional element according to claim 1.

* * * * *